(12) United States Patent
McDonald

(10) Patent No.: US 7,218,650 B2
(45) Date of Patent: May 15, 2007

(54) WAVELENGTH REFERENCE FILTER

(75) Inventor: Mark McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 10/750,481

(22) Filed: Dec. 31, 2003

(65) Prior Publication Data

US 2005/0147134 A1 Jul. 7, 2005

(51) Int. Cl.
  *H01S 3/10* (2006.01)
(52) U.S. Cl. .......................................................... 372/9
(58) Field of Classification Search ................... 372/9, 372/29, 32, 20
  See application file for complete search history.

(56) References Cited

U.S. PATENT DOCUMENTS

| | | | |
|---|---|---|---|
| 6,008,675 A * | 12/1999 | Handa | 327/96 |
| 6,498,800 B1 | 12/2002 | Watterson et al. | |
| 6,658,031 B2 | 12/2003 | Tuganov et al. | |
| 6,763,047 B2 | 7/2004 | Daiber et al. | |
| 6,788,724 B2 | 9/2004 | Sell et al. | |
| 6,853,654 B2 | 2/2005 | McDonald et al. | |
| 2002/0054614 A1 * | 5/2002 | Jin | 372/20 |
| 2002/0126345 A1 * | 9/2002 | Green et al. | 359/122 |
| 2002/0136104 A1 | 9/2002 | Daiber | |
| 2002/0172239 A1 * | 11/2002 | McDonald et al. | 372/20 |

OTHER PUBLICATIONS

Gilbert, et al. "Wavelength accuracy in WDM: Techniques and standards for component characterization," *Optical Fiber Communication Conference* (OFC 2002) pp. 391-393.
Niemi, "Dispersion measurements of fiber-optic components and applications of a novel tunable filter for optical communications," [online] (Projected publication Jun. 2002).

* cited by examiner

*Primary Examiner*—Dung T. Nguyen
(74) *Attorney, Agent, or Firm*—Marshall, Gerstein & Borun LLP

(57) ABSTRACT

A wavelength reference filter for receiving an input signal and producing a filtered output signal is provided. The operation of the filter is independent of the angle of incidence of the input signal. As a result, the output signal from the filter will maintain its wavelength, even under changes in the direction of propagation of the input signal to the filter. Without such incidence angle independence, a change to the input signal would change the output signal and result in inaccurate device operation. Example incidence angle independent filters may include a single etalon or multiple etalons. In the former example, a signal may traverse a single etalon twice, along paths that have different angular sensitivities relative to the etalon. In the latter example, each etalon may have an equal and opposite angular sensitivity, such that two the etalons have canceling angular sensitivities. All of the filters described and illustrated may be used in various devices, including detectors, laser sources (tunable and otherwise), and transponders.

19 Claims, 5 Drawing Sheets

WAVELENGTH REFERENCE FILTER

TECHNICAL FIELD OF THE DISCLOSURE

This patent generally relates to laser sources and more particularly to a wavelength reference apparatus for a laser source.

BACKGROUND OF THE RELATED ART

Laser sources are important to data transmission in communication networks, small and large. In smaller-scale networks like local-area networks (LANs), for example, an individual laser source may be used to produce a signal at a single frequency. Modulation of that single frequency imparts the data for that signal. For larger networks such as metro-area networks (MANs), a wavelength division multiplexing (WDM) system may employ a laser source capable of producing a range of output frequencies. In this latter example, many channels that each represents a different data stream may be propagated on a single optical fiber. An example dense WDM system might include approximately one-hundred channels propagating on a single fiber, each channel emitting from a laser source capable of producing a range of output frequencies within the C-band from 1525 to 1565 nm.

WDM laser sources may include banks of individual lasers, each producing a different channel. The output signals from these individual lasers are typically multiplexed together into an optical fiber or fiber bundle. The WDM laser sources may be tunable lasers or "single" frequency lasers.

In these and many other applications, stable control over laser source output frequency and bandwidth is paramount to device operation. In fact, there are numerous networking industry standards that set-forth acceptable laser transponder performance. Various Telcordia™ Technology's, Synchronous Optical Network's (SONET), and International Telecommunication Union's (ITU) standards are examples, some of which are directed to wavelength control.

Although communications standards are in place and fabrication techniques well-developed, lasers designed for stability and predictability can in fact produce inaccurate output frequencies over the device lifetime (a lifetime often specified as 25 years). These lasers may fail to produce acceptable output bandwidths and power levels, as well.

To correct for these and other problems, wavelength locking techniques are often used. The principle desire behind wavelength locking is a need for stable and predictable output frequency. Wavelength locking is commonly achieved by a wavelength reference filter, or wavelength locker. Most wavelength reference filters not only optimize output frequency, but also they simultaneously produce narrow bandwidth output signals when used with appropriate servo systems. With such benefits, wavelength reference devices are particularly useful in WDM systems where frequency control and tight channel spacing between frequencies is essential to avoid crosstalk errors. Wavelength reference filters may both correct and enhance laser source performance.

There are numerous ways to design a laser with precise output frequency and bandwidth. A relatively affordable, commonly used technique for wavelength locking is to use a partially-transmitting, resonant-cavity filtering element, such as an etalon. The etalon is an optical device that is only able to sustain wavelengths that are harmonics of its cavity length. The sustainable output wavelengths from an etalon are set by the resonance condition of the etalon cavity, and, as a result, the etalon may be used to determine the accuracy to which an input wavelength matches a desired output wavelength, by selecting an etalon with a predetermined optical cavity length. Etalons are tunable across a range of optical cavity lengths, for example through temperature tuning.

Although useful, etalons may introduce a relatively low but nevertheless detrimental error to laser source operation. Some of the problems stem from the physical properties of an etalon. For example, etalons are partially transmissive and partially reflective. When an etalon is placed perpendicular to an incident laser signal (an orientation that optimizes etalon transmission), etalons may reflect substantial amounts of the laser energy back at the laser source. For this reason, etalons are typically tilted from this perpendicular or normal incidence. Such an etalon tilt, however, introduces another problem—a first order dependence of output frequency on the angle of incidence of the laser energy. As a result of this dependence, perturbation of the incidence angle will result in an error in the output frequency from the etalon. For small tilting angles, the error may be tolerably low for coarse wavelength division multiplexing networks. Dense wavelength division multiplexing networks utilize ever increasing numbers of channels, with concomitantly ever decreasing tolerances for crosstalk-inducing wavelength error. These same etalon deficiencies plague independent detection systems, as well as integrated laser sources. Detection systems based on etalons may have reduced performance, as a result.

DETAILED DESCRIPTION OF A PREFERRED EXAMPLE

Figure 1:
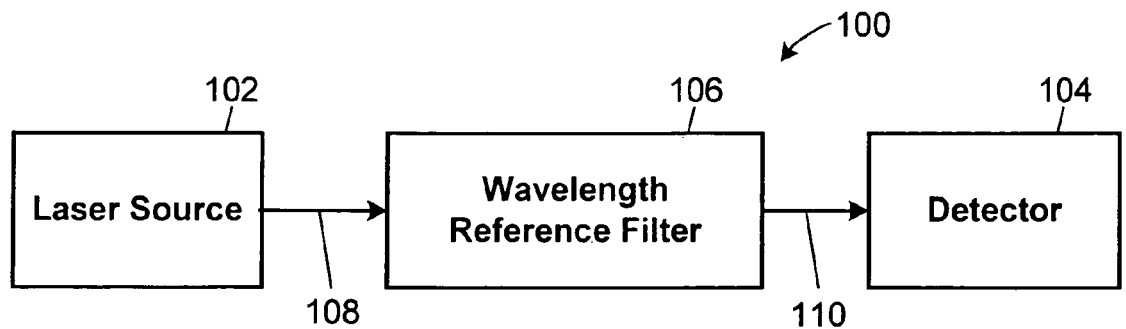
FIG. 1 is a block diagram of a laser device having a wavelength reference filter.

FIG. 1 illustrates an optical system 100 that may be used as a wavelength reference device, or wavelength locker. The system 100 includes a laser source 102 coupled to a detector 104. The system 100 may be used as a detector alone or as a laser source, for example, a tunable laser device with a detector for wavelength control and/or output power regulation. Example laser sources include solid state, gas, chemical, and fiber lasers. Diode lasers are commonly used in communication networks. More generally, the laser source 102 may represent other sources of an optical signal including a waveguide, fiber, free space region or lens. The detector 104 may measure frequency, amplitude, or any other metric useful to characterize an optical signal.

A wavelength reference apparatus 106 is positioned between the laser source 102 and the detector 104. The wavelength reference apparatus 106 is essentially independent of angle of incidence. As such, the incidence angle of an input beam 108 from the laser source 102 does not significantly affect the characteristic metric of a filtered beam coupled 110 to the detector 104. In other words, the properties of the beam 110 measured by the detector 104 are essentially independent of the incidence angle of the beam 108 on the wavelength reference apparatus 106. Without such incidence angle independence, the frequency of the beam 110 measured by the detector 104 would be altered with changes in incidence angle, resulting in errors in the measurements in the detector 104. The beams 108 and 110 may be information carrying laser signals, pulsed or continuous wave, or un-modulated laser energies.

Figure 2:
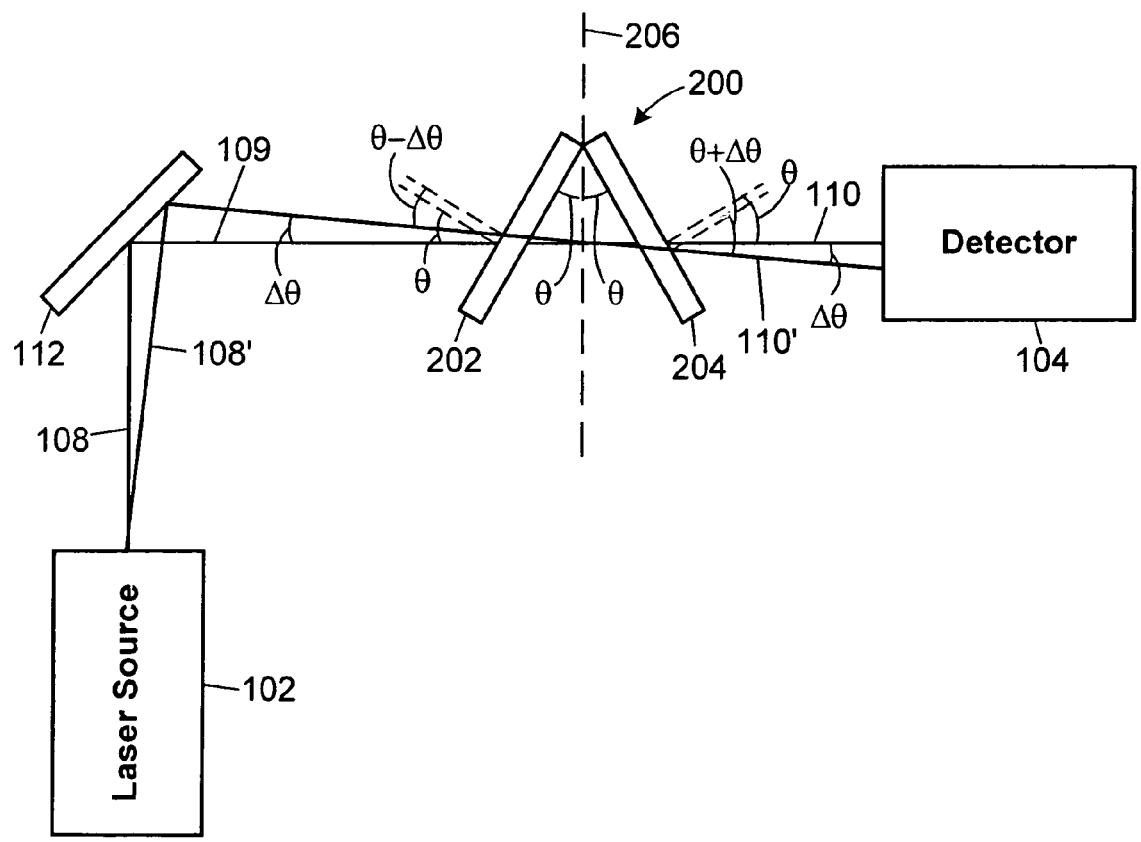
FIG. 2 is a detailed illustration of an example optical device including a wavelength reference filter formed of two filter elements of different angular dependence.

FIG. 2 illustrates an example of a suitable wavelength reference device that may be used as the device 106. FIG. 2 is similar to FIG. 1 and therefore like reference numerals have been retained for like structure. In the example of FIG. 2, the laser source 102 produces the output signal 108 that impinges upon and is reflected by a mirror 112 onto a wavelength reference assembly 200. The reference assembly 200 includes a first filter element 202, in the form of a first etalon, and a second filter element 204, in the form of a second etalon. The etalons 202 and 204 may be formed of a silicon material having a relatively high index of refraction. Other example materials include fused silica, BK7, or other materials transmissive in the wavelength band of interest.

The first filter element 202 is angled, an angle θ with respect to a plane 206 normal to the direction of incidence of the signal 108. Similarly, the second filter element 204 also forms an angle, θ, with the plane 206. In the illustrated configuration, the etalons 202, 204 are tilted with respect to one another to produce equal and opposite angular dependence.

The incidence angle independence of an incident light may be described with reference to the illustrated inputs 108 and 108' of FIG. 2. The input beam 108 may be considered as a reference beam along a reference axis 109. The filter element 202 has a surface normal that forms an incidence angle, θ, with respect to the beam 108. The output beam 110 also forms an angle, θ, with respect to a surface normal of the second filter element 204, as shown.

Under some operating conditions, the incident beam may be offset with respect to the reference position of axis 109. For example, the laser source 102 or the mirror 112 may be moved during device operation or assembly. With the illustrated configuration, changes in the incidence angle of the beam 108 will not affect the spectral filter peak property of the output beam 110 arriving at detector 104. For example, with the beam 108' being offset an angle Δθ from the beam 108, the angle of incidence upon the first filter element 202 reduces from θ to θ−Δθ, as illustrated. That is, this change in incidence angle imparts a first angular sensitivity on the device 200, a negative sensitivity characterized by −Δθ. Angular sensitivity refers to a device's response to changes in angle incidence. A negative sensitivity will result in a shift to a lower resonance frequency of the output beam 208. That is, an increased angle of incidence will result in a shift to a higher resonance frequency.

In the illustrated example, whereas the filter element 202 has a −Δθ response to the illustrated change in incidence angle, the second element 204 has a +Δθ sensitivity, evidenced by the exit angle on the element 204 increasing from θ to θ+Δθ for the output beam 110' compared to the beam 110. Thus, in the illustrated example, for a change in incident angle represented by 108', the system 200 has filter elements 202, 204 of equal and opposite angular sensitivity that cancel one another leaving the detected output beam 110' with the same measurable characteristic metrics (e.g., peak transmission occurs at the same wavelength) as output beam 110. The sensitivity of either or both of the filter elements 202 and 204 may be tuned using a similar etalon to that shown in FIG. 6 and described below.

Figure 3:
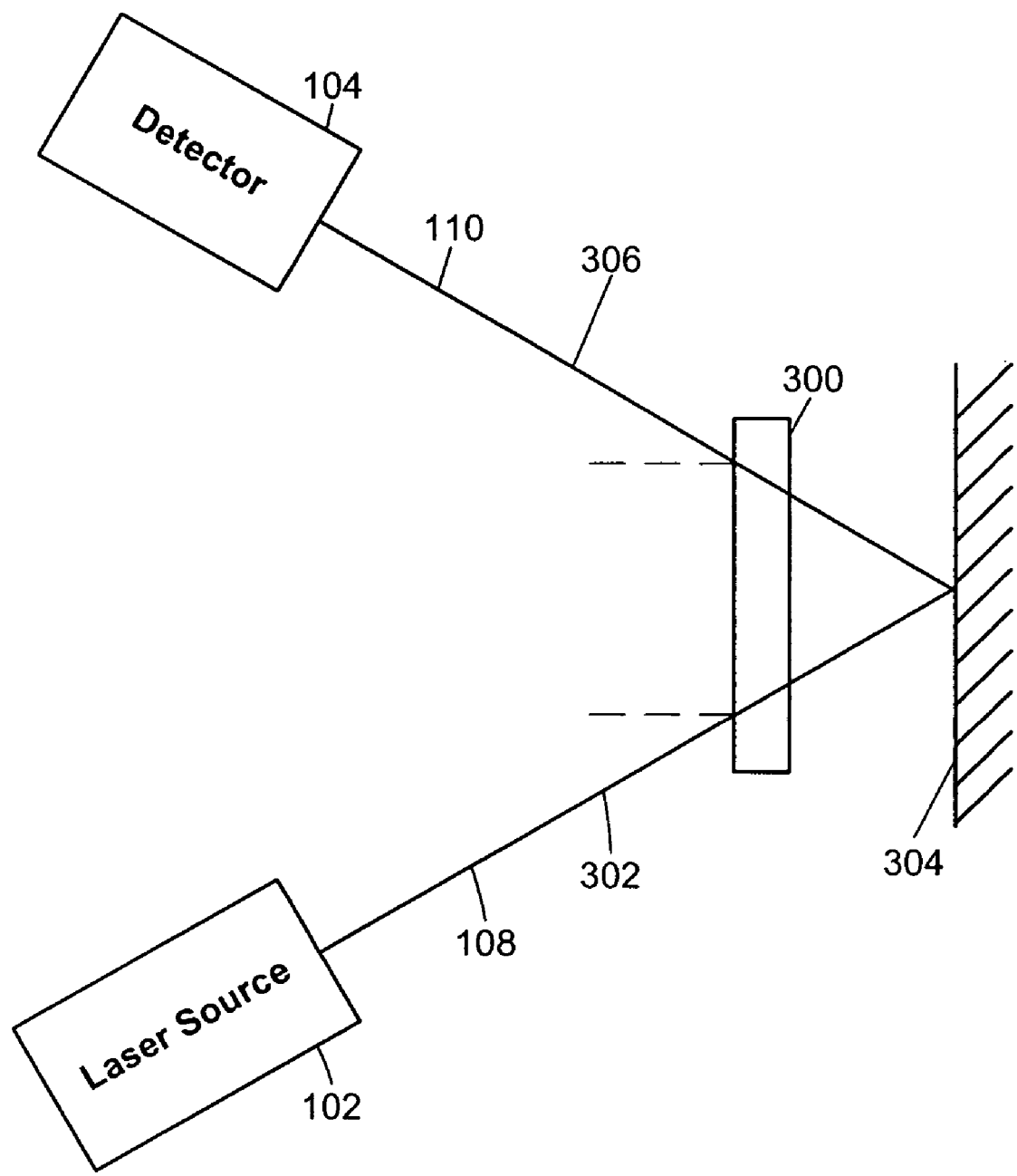
FIG. 3 is an illustration of another wavelength reference filter including a single filter element.

In addition to the two-filter element example of FIG. 2, the system 100 implemented with a single filter element (as illustrated in the example of FIG. 3) retains these characteristics. The laser source 102 emits the output energy 108, which is coupled to the detector 104 after passing through a filter element 300. The energy 108 actually passes along a first optical path 302 and is reflected by a highly reflective mirror 304 into a second optical path 306. Both optical paths 302 and 306 are along a reflected, reference axis that passes through the filter 300. The filter element 300 is an etalon that has a first angular sensitivity along the first optical path 302 and a second, equal and opposite angular sensitivity with respect to in plane rotations of the etalon along the second path 306.

Figure 4:
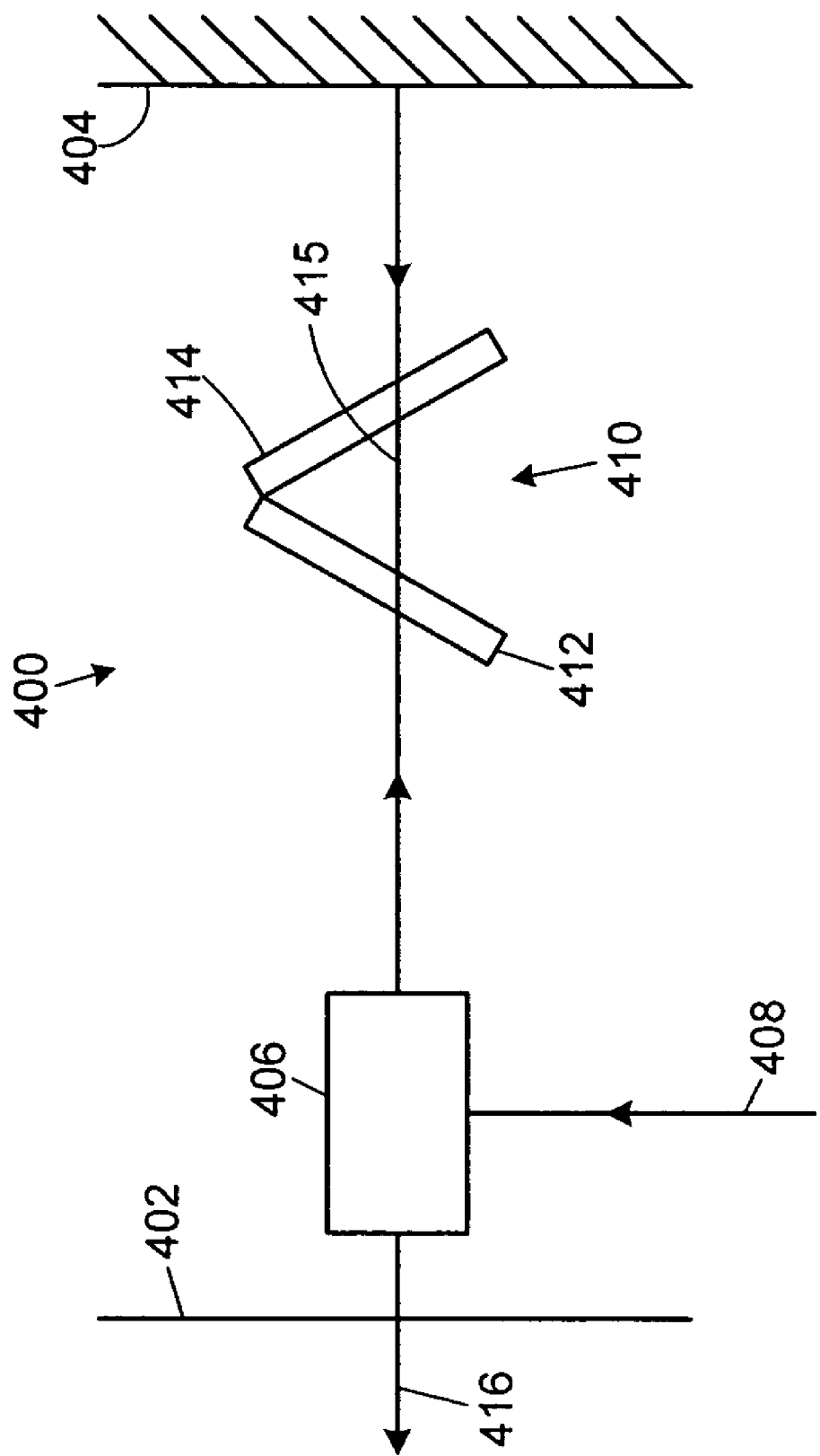
FIG. 4 is an illustration of a wavelength reference filter similar to that of FIG. 2, but placed internal to a laser cavity.

FIGS. 1–3 illustrate wavelength reference filters that are external to a laser source or laser cavity. Configurations for achieving incidence angle independence may also be used within a laser or amplifier, for example, to impart tunability or enhance performance. An example device 400 is shown in FIG. 4.

The device 400 may be a laser having a laser cavity extending between two mirrors 402, 404 with at least one of these mirrors (mirror 402 in the illustrated example) being a partially transmitting mirror for providing an output signal. Both mirrors 402 and 404 form a laser cavity. The apparatus 400 also includes a gain medium 406, which is a lasing medium pumped by an input pump 408 to produce a coherent light within the laser cavity. The gain medium 406 may be any known lasing medium, or it may be an amplifier or dedicated laser source. The medium 406, for example, may represent a semiconductor (or other solid-state), fiber, gas, or liquid laser or a fiber amplifier. Although, the beam produced by the medium 406 may be optimized for the currently utilized communication wavelength windows, for example the C-band window, the output from the medium 406 may extend more broadly across a range of electromagnetic frequencies.

The pump signal 408 may be an optical signal or an electrical signal, such as a (direct current) AC or (alternating current) DC power signal or a modulation signal. In the laser cavity is an apparatus 410, similar to the apparatus 200, formed of a first filter element 412 and a second filter element 414. Both filter elements 412, 414 have a substantially equal and opposite angular sensitivities, with respect to a reference axis 415, that cancel one another to ensure that the apparatus 410 operates independent of changes in the positions of the mirrors 402, 404, the medium 406, or any other components that may alter the incidence angle. In the illustrated configuration, the material and thickness of the elements 412, 414 may be chosen to filter the broad bandwidth energy from the region 406 into a narrow bandwidth laser signal provided as output signal 416. Due to the device 410, the peak frequency on output signal 416 will be free from substantial change due to changes in incidence angle or beam float within the device 400.

The angular positions of the various filters shown in the examples of FIGS. 1–4 may be changed. For example, in dual-filter embodiments the angles formed by each filter with a plane normal to a reference axis may be different from one another, for example to balance relative angular sensitivities. This may be particularly useful where filter elements of different material, thickness, or properties are used.

Additionally, while filter elements are shown as etalons having substantially parallel entrance and exit faces, the filter elements may have non-parallel entrance and exit faces insofar as the surfaces comprise a resonator. In these cases, the filter elements may still be positioned relative to one another and to the incidence beam to cancel angular dependence.

Figure 5:
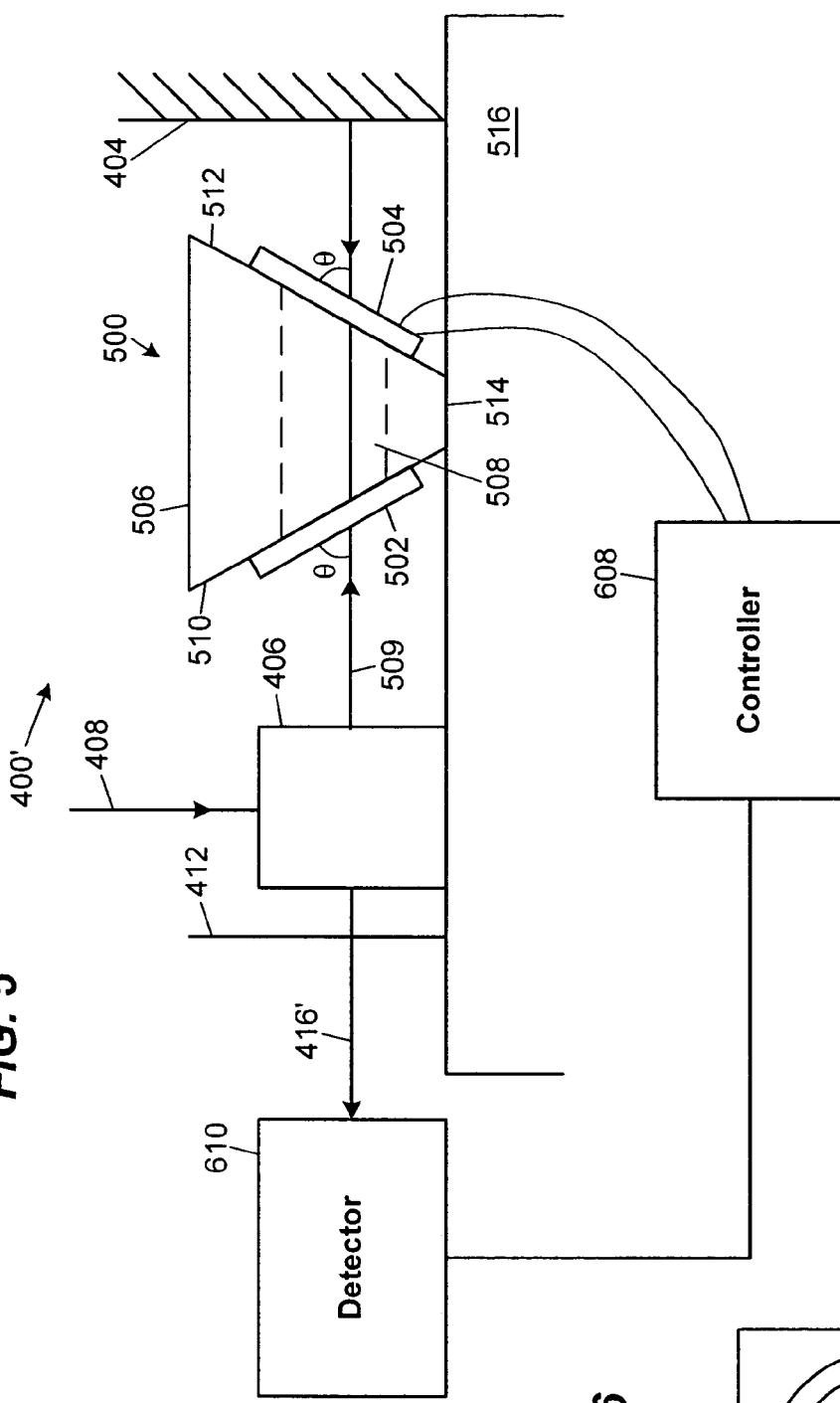
FIG. 5 is an illustration of another example wavelength reference filter used in a laser device.

FIG. 5 illustrates another example device 400' having a dual etalon wavelength reference filter 500 in place of the filter 410. The device 500 includes a first filter element 502 and a second filter 504 both of which are mounted to a support 506, which in the illustrated example is wedge shaped and includes an aperture 508 extending across its length between the filter elements 502, 504. The filter elements 502 and 504 may be bonded, fused, or clamped to the support 506, for example, and form angles, θ (as shown), with a reference axis 509. In the illustrated example, this angle is defined by the tapering angle on side walls 510 and 512 of the wedge 506. The support 506 has a base 514 that may be clamped, bonded or formed on a substrate 516 supporting the device 400'. Alternatively, the base 514 may simply rest on the substrate 516. The support 506 may be formed of a material having a relatively low coefficient of thermal expansion, e.g., aluminum nitride, tungsten, or certain steels such as kovar or invar. The material used for the substrate 506 may have a coefficient of thermal expansion similar to that of the materials used to form the filters 502 and 504, such that any increase in device temperature will have a similar equal effect to that on filter elements 502 and 504 and the support 506. This will retain the orientation between the elements 502 and 504 and minimize angular drift with respect to one another.

To allow for tunable filtering of output beam 416', either or both of the filtering elements 502 and 504 may have adjustable optical properties. For example, either of the filters 502 and 504 may be temperature tunable using the example structure of FIG. 6, which shows an etalon 600 with a low-resistance heating electrode 602 for heating and expanding the etalon 600. With the electrode 602, thermal expansion will allow an operator to controllably adjust the optical path length of the filter elements 502 and/or 504 and thereby selectively tune the wavelength locking of the device 500. To detect the temperature of the tunable filter element 600, a second electrode 604 is also disposed on the filter element 600. The electrode 604 may be a higher-resistance electrode.

Figure 6:
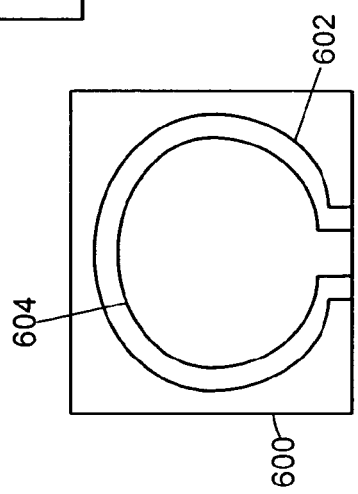
FIG. 6 is an illustration of a tunable filter element that may be used in a wavelength reference filter.

The heating electrode 602 is coupled to a drive circuit and the sensing electrode 604 to a sensing circuit. Both the drive circuit and the sensing circuit may be separately formed or part of a controller 608, see FIG. 5. By having a heating electrode and a sensing electrode, the tuning of a filter element may be achieved as part of a feedback control loop. The controller 608 is part of an example servo control loop. The controller 608 may include a central processor, accessing a memory of preferred temperature settings corresponding to desired output frequencies. The controller 608 may measure the resistance of the electrode 604 alone or may derive an actual temperature measurement in controlling the electrode 602. The temperature setting data and temperature sensing data may be stored and provided to a monitor for display to an operator. The controller 608 may be part of a control loop including a detector 610 that measures an optical wave metric, e.g., the frequency or amplitude of the output 416'. Although an example thermal tuning apparatus is illustrated in FIG. 6, persons of ordinary skill in the art will appreciate that other tuning mechanisms may be used, such as angle or strain tuners.

The filters described herein may be used in a detection system such as that illustrated in FIG. 1 or in laser systems as in the examples of FIGS. 4 and 5. These are only example illustrations, however. The filters and wavelength references described herein may be used in a great many devices. A further example device is illustrated in FIG. 7, which illustrates a transponder 700 that has a laser source employing an incidence angle independent wavelength reference filter or an incidence angle independent tunable filter or laser.

Figure 7:
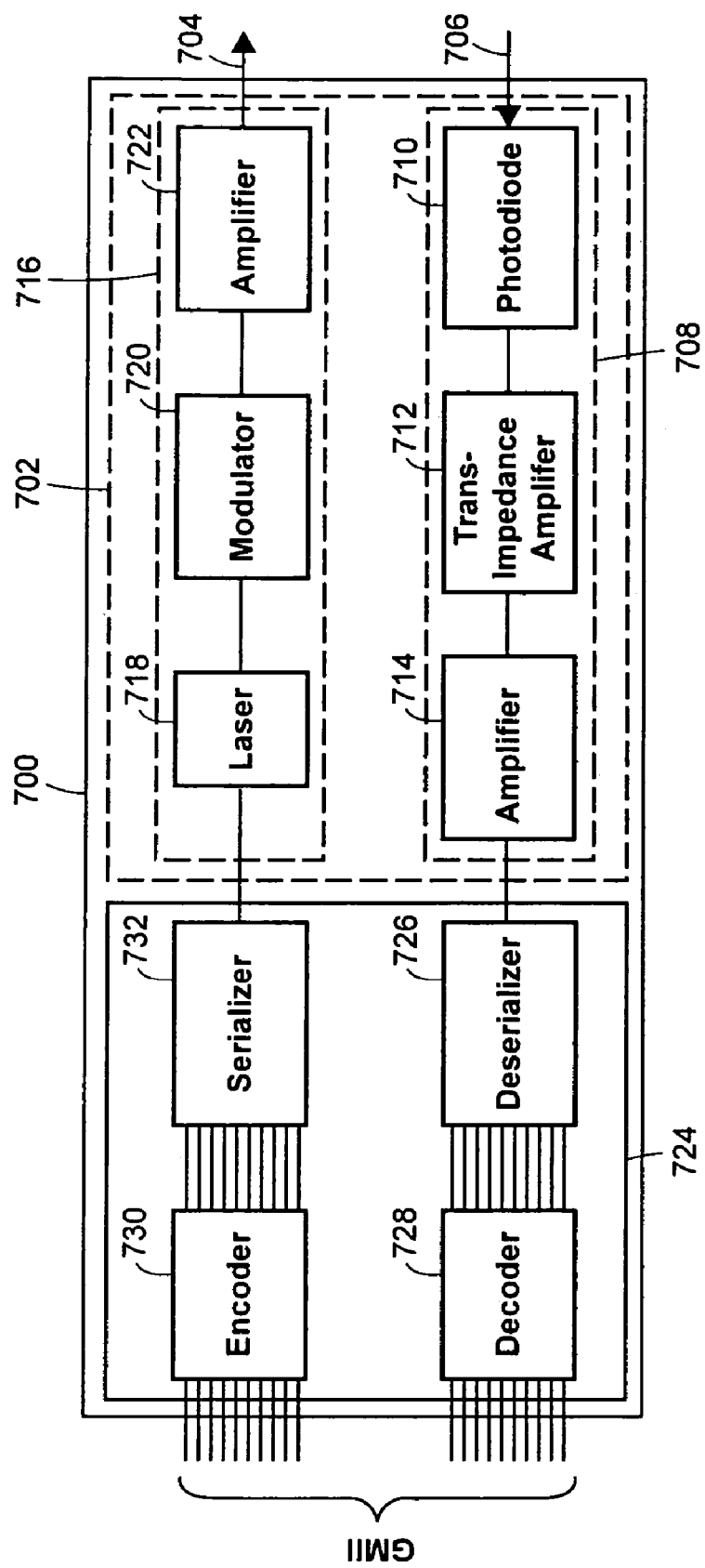
FIG. 7 is block diagram of an example transponder within which a wavelength reference filter may be used.

FIG. 7 shows an example high-level block diagram of the transponder 700. The transponder 700 includes a transceiver 702 for transmitting and receiving data streams along fibers 704 and 706, respectively. A receiver 708 includes a photodiode 710, a trans-impedance amplifier 712, and a separate boosting amplifier 714. A transmitter 716 includes a laser 718, a modulator 720, and an amplifier 722. While a single transceiver 702 is shown, it will be understood by persons of ordinary skill in the art that the transponder 700 may have multiple transceivers or that each depicted block may represent a bank of blocks. For example, the blocks 710 and 718 may be a plurality of photodiodes and lasers, respectively.

The transceiver 702 is connected to a controller 724, e.g. an application specific integrated circuit (ASIC), multiple integrated circuits, or a microprocessor. The controller 724 may be a microcontroller like the 8051 microcontroller available from Intel Corporation. Or any one of the Intel (Intel Corporation of Santa Clara, Calif.) family of microprocessors may be used, including Pentium®, Xeon™, Itanium™, and Centrino™-based microprocessors. Alternatively, a chipset like the LXT16768, LX16769, or LXT16759 (also available from Intel Corporation) may be used. For the receiver 708, the controller 724 includes a deserializer 726 coupled to the amplifier 714 and a decoder 728 coupled to the deserializer 726. For the transmitter 716, the controller 724 includes an encoder 730 and a serializer 732.

In operation, a multi-channel or single channel data stream is received on the fiber 706. The data-stream is coupled into the photodiode 710 for optical-to-electrical signal conversion. Data from the photodiode 710 is coupled to the trans-impedance amplifier 712 and sent on to the amplifier 714 prior to being sent to the deserializer 726. The deserializer 726 provides a 10 bit signal to decoder 728 that decodes the input signal, and the 10 bit word from the decoder 728 is passed to a Gigabit Media Independent Interface (GMII). For data transmission, input data from the GMII is first encoded by the encoder 730 and then serialized by the serializer 732 to create a transmittable serial bit stream. The output from the serializer 732 controls the output of the laser 718, said output being modulated by the modulator 720 and then amplified by the amplifier 722 prior to transmission on the fiber 704.

The illustration of FIG. 7 is an example, and it will be understood by persons of ordinary skill in the art that additional control blocks and routines may be used or that some of the control blocks of FIG. 7 may be eliminated or replaced. For example, the controller 724 may include an internal clock, a clock and data recovery device (CDR), phase control via phase locked loops (PLL), and/or error correction control circuitry. Furthermore, while not necessary, the transponder 700 may be compliant with any known network communications standards of which SONET formats OC-48 (2.5 Gbps), OC-192 (10 Gbps), and OC-768 (40 Gbps) are examples.

Although certain apparatus constructed in accordance with the teachings of the invention have been described

What I claim is:

1. For use with a laser source providing light along a reference axis, an optical filter comprising:
   a first filter element having a first angular sensitivity to the reference axis and for tuning a wavelength of the light in response to changes in an angle of incidence of the light upon the first filter element;
   a second filter element having a second angular sensitivity to the reference axis for tuning the wavelength in response to changes in an angle of incidence of the light upon the second filter element, wherein the second angular sensitivity substantially cancels the first angular sensitivity, wherein the wavelength of the light is not tuned by simultaneous rotation of the first and second filter elements relative to the reference axis; and
   a support having a first side wall with a first tapering angle and a second side wall opposite the first side wall and with a second tapering angle, the first filter element being mounted to the first side wall, the angle of incidence of the light upon the first filter element being defined by the first tapering angle, the second filter element being mounted to the second side wall, the angle of incidence of the light upon the second filter element being defined by the second tapering angle.

2. The optical filter of claim 1, wherein the first angular sensitivity is a positive angular sensitivity and wherein the second angular sensitivity is a negative angular sensitivity.

3. The optical filter of claim 1, wherein the first filter element is a first etalon and the second filter element is a second etalon, wherein the first etalon forms a first acute angle with the direction of incidence and wherein the second etalon forms a second acute angle with the direction of incidence.

4. The optical filter of claim 3, wherein the first acute angle is substantially equal to the second acute angle.

5. The optical filter of claim 1, wherein at least one of the first filter element and the second filter element is a tunable filter element.

6. The optical filter of claim 5, wherein the tunable filter element comprises a first resistive element for heating the tunable filter element.

7. The optical filter of claim 6, wherein the tunable filter element comprises a second resistive element for measuring a tunable parameter of the tunable filter element.

8. The optical filter of claim 1, further comprising a detector coupled to measure a tunable characteristic of the light.

9. The optical filter of claim 8, wherein the tunable characteristic is wavelength.

10. The optical filter of claim 1, wherein the first angular sensitivity is offset from the second angular sensitivity.

11. The optical filter of claim 1, wherein the support is formed of a material having a coefficient of thermal expansion that minimizes angular drift between the first filter element and the second filter element under a change in temperature.

12. A laser device comprising:
   a gain medium;
   a laser cavity for receiving a light from the gain medium; and
   a filter apparatus disposed to receive the light at an angle of incidence, the filter apparatus and the laser cavity defining a reference axis, the filter apparatus comprising a first filter element having a first angular sensitivity to the reference axis and a second filter element having a second angular sensitivity to the reference axis that substantially cancels the first angular sensitivity wherein a wavelength of light produced by the laser cavity is substantially independent of the angle of incidence, the filter apparatus comprising a support having a first side wall with a first tapering angle and a second side wall opposite the first side wall and with a second tapering angle, the first filter element being mounted to the first side wall and the second filter element being mounted to the second side wall.

13. The laser device of claim 12, wherein the filter apparatus is disposed within the laser cavity.

14. The laser device of claim 12, wherein the filter apparatus is external to the laser cavity.

15. The laser device of claim 12, wherein the support is formed of a material having a coefficient of thermal expansion that minimizes angular drift between the first filter element and the second filter element under a change in temperature.

16. The laser device of claim 12, wherein the filter apparatus is a temperature tuning apparatus.

17. A transponder comprising:
   a receiver;
   a transmitter; and
   a laser source for producing a laser energy at a wavelength, the laser source having a filter apparatus disposed to receive the laser energy, where the filter apparatus comprises a first filter element having a first angular sensitivity to a reference axis of the laser source and a second filter element having a second angular sensitivity to the reference axis that substantially cancels the first angular sensitivity, the wavelength of the laser energy being substantially independent of the angular position of the filter apparatus, the laser source comprising a support having a first side wall with a first tapering angle and a second side wall opposite the first side wall and with a second tapering angle, the first filter element being mounted to the first side wall and the second filter element being mounted to the second side wall.

18. The transponder of claim 17, wherein the support is formed of a material having a coefficient of thermal expansion that minimizes angular drift between the first filter element and the second filter element under a change in temperature.

19. The transponder of claim 17, wherein the filter apparatus is tunable.

* * * * *